(12) United States Patent
Park

(10) Patent No.: US 7,205,715 B2
(45) Date of Patent: Apr. 17, 2007

(54) ACTIVE MATRIX ORGANIC ELECTROLUMINESCENT DISPLAY DEVICE AND METHOD OF FABRICATING THE SAME

(75) Inventor: Jae-Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/958,263

(22) Filed: Oct. 6, 2004

(65) Prior Publication Data

US 2005/0057152 A1  Mar. 17, 2005

Related U.S. Application Data

(62) Division of application No. 10/330,259, filed on Dec. 30, 2002, now Pat. No. 6,806,504.

(30) Foreign Application Priority Data

Dec. 29, 2001  (KR) ............................... 2001-88539

(51) Int. Cl.
*H01L 51/00* (2006.01)
*H01J 9/22* (2006.01)
*B05D 5/12* (2006.01)

(52) U.S. Cl. .................... 313/506; 313/504; 445/24; 427/66

(58) Field of Classification Search ............ 313/500, 313/504, 506; 315/169.3, 169.1; 345/45, 345/67; 428/690, 917; 445/24; 427/64, 427/66
See application file for complete search history.

(56) References Cited

U.S. PATENT DOCUMENTS

| 6,380,672 | B1 * | 4/2002 | Yudasaka ..................... 313/504 |
| 6,476,988 | B1 | 11/2002 | Yudasaka |
| 6,580,212 | B2 | 6/2003 | Friend |
| 6,812,052 | B2 * | 11/2004 | Lu .............................. 438/29 |
| 6,828,726 | B2 * | 12/2004 | Sakurai et al. .............. 313/506 |
| 2001/0026125 | A1 * | 10/2001 | Yamazaki et al. .......... 313/505 |
| 2003/0052597 | A1 * | 3/2003 | Sakurai ....................... 313/504 |
| 2003/0127974 | A1 * | 7/2003 | Miyazawa .................. 313/504 |

* cited by examiner

*Primary Examiner*—Karabi Guharay
(74) *Attorney, Agent, or Firm*—Morgan, Lewis & Bockius, LLP

(57) ABSTRACT

An active matrix organic electroluminescent device includes a substrate, a buffer layer on the substrate, a thin film transistor on the buffer layer, a passivation layer on an entire surface of the substrate covering the thin film transistor, a first electrode disposed on the passivation layer to contact the thin film transistor through a contact hole formed in the passivation layer, a first bank layer disposed on the first electrode and on the passivation layer, the first bank layer having a first bank opening exposing a portion of the first electrode, a second bank layer disposed on the first bank layer to have a second bank opening aligned with the first bank opening, an organic electroluminescent layer formed within the first bank opening to electrically contact the first electrode and the first bank layer, and a second electrode formed on the organic electroluminescent layer and on the second bank layer within the first and second bank openings.

10 Claims, 11 Drawing Sheets ated on what type of
ACTIVE MATRIX ORGANIC ELECTROLUMINESCENT DISPLAY DEVICE AND METHOD OF FABRICATING THE SAME This is a divisional of application Ser. No. 10/330,259, now U.S. Pat. No. 6,806,504, filed on Dec. 30, 2002.

The present invention claims the benefit of Korean Patent Application No. 2001-0088539 filed in Korea on Dec. 29, 2001, which are hereby incorporated by reference.

BACKGROUND OF THE INVENTION

1. Field of the Invention

The present invention relates to an organic electroluminescent display device, and more particularly, to an active matrix electroluminescent display devices and a method of fabricating the same.

2. Discussion of the Related Art

Currently, the need for flat panel displays having thin profiles, lightweight, and lower power consumption has increased. Accordingly, various flat panel display (FPD) devices such as liquid crystal display (LCD) devices, plasma display panels (PDPs), field emission display (FED) devices, and electroluminescence display (ELD) devices are being developed now.

Among the many different types of FPD devices, the electro luminescence display (ELD) device is the only one that makes use of electroluminescence phenomenon in which light is generated when an electric field is applied to a fluorescent substance. The electroluminescence display (ELD) devices can be classified into inorganic electroluminescence display (ELD) devices and organic electroluminescence display (ELD) devices depending on what type of source excites carriers in each of the devices. The organic electroluminescent display (ELD) device can display colors within a range of visible wavelengths and has a high brightness and a low action voltage. In addition, since the organic electroluminescence display (ELD) devices are self-luminescent, they have a high contrast ratio and are suitable for ultra-thin type display devices. Moreover, since they have a simple manufacturing process, environmental contamination during manufacturing is relatively low. Furthermore, the organic electro luminescence display (ELD) devices have a few microseconds (µs) response time so that they are suitable for displaying moving images. The organic electroluminescence display (ELD) devices are not limited by their viewing angle, and are stable under low temperature operating conditions. Accordingly, they can be driven with a relatively low voltage (between 5V and 15V), thereby simplifying manufacturing and design of corresponding driving circuitry.

Structures of the organic electroluminescent display (ELD) devices are similar to the structures of the inorganic electroluminescence display (ELD) devices, but the light-emitting system is different from that of the inorganic electroluminescence display (ELD) devices. For example, the organic electro luminescent display (ELD) devices emit light by a recombination of an electron and a hole, whereby they are often referred to as organic light emitting diodes (OLEDs). In addition, active matrix type systems having a plurality of pixels arranged in a matrix form with a thin film transistor connected thereto has been widely applied to the flat panel display devices. The active matrix type systems are also applied to the organic electroluminescent display (ELD) devices and are commonly referred to as an active matrix organic electroluminescent display (ELD) device.

FIG. 1 is a cross sectional view of an active matrix organic electro luminescent display device according to the related art. In FIG. 1, a buffer layer 11 is formed on a substrate 10, and a first polycrystalline silicon layer having first to third portions 12a, 12b, and 12c and a second polycrystalline silicon layer 13a are formed on the buffer layer 11. The first polycrystalline silicon layer is divided into the first portion 12a (i.e., an active region) where impurities are not doped, into the second portion 12b (i.e., a drain region), and into the third portion 12c (i.e., a source region) where the impurities are doped. The second polycrystalline silicon layer 13a functions as a capacitor electrode.

A gate insulation layer 14 is disposed on the active region 12a, and a gate electrode 15 is disposed on the gate insulation layer 14. A first interlayer insulator 16 is formed on the gate insulation layer 14 and the gate electrode 15, while covering the drain and source regions 12b and 12c and the second polycrystalline silicon layer 13a. A power line 17 is disposed on the first interlayer insulator 16 above the second polycrystalline silicon layer 13a. Although not shown, the power line 17 extends along one direction as a line. The power line 17, the second polycrystalline silicon layer 13a, and the first interlayer insulator 16 form a storage capacitor. A second interlayer insulator 18 is formed on the first interlayer insulator 16 to cover the power line 17.

First and second contact holes 18a and 18b penetrate both the first and second interlayer insulators 16 and 18 to expose portions of the drain region 12b and source region 12c, respectively. In addition, a third contact hole 18c that penetrates the second interlayer insulator 18 is formed to expose a portion of the power line 17. A drain electrode 19a and a source electrode 19b are formed on the second interlayer insulator 18, whereby the drain electrode 19a contacts the drain region 12b through the first contact hole 18a, and the source electrode 19b contacts both the source region 12c and the power line 17 through the second contact hole 18b and through the third contact hole 18c, respectively.

A passivation layer 20 is formed on the drain and source electrodes 19a and 19b and on the exposed portions of the second interlayer insulator 18. The passivation layer 20 has a fourth contact hole 20a that exposes a portion of the drain electrode 19a. A first electrode 21 that is made of a transparent conductive material is disposed on the passivation layer 20 to electrically contact the drain electrode 19a through the fourth contact hole 20a. A bank layer 22 is formed on the first electrode 21 and on the exposed portions of the passivation layer 20, and has an opening 22a (often referred to as a bank) that exposes a portion of the first electrode 21. An electroluminescent layer 23 is formed in the bank 22a of the bank layer 22. On the exposed portions of the bank layer 22 and on the electroluminescent layer 23, a second electrode 24 is formed of an opaque metallic conductive material.

In FIG. 1, the first electrode 21 is formed of the transparent conductive material, and the second electrode 24 is formed of the opaque conductive material. Accordingly, the light emitted from the organic electroluminescent layer 23 is released along a bottom direction, which is commonly called a bottom emission-type device.

FIG. 2 is an enlarged cross sectional view of a portion A of FIG. 1 according to the related art, and FIG. 3 is a plan view of the enlarged portion A of FIGS. 1 and 2 according to the related art. In FIGS. 2 and 3, the organic electroluminescent layer 23 is generally formed of a high molecular substance, whereby a solvent dissolves the high molecular substance and the dissolved high molecular substance is deposited into the bank opening 22a and on the bank layer 22 by an ink-jet technique. Then, the liquid high molecular substance on the bank layer 22 flows into the bank opening 22a during a heat treatment process. As a result of the heat treatment process, the organic electroluminescent layer 23 is formed in the bank opening 22a, and the solvent and other impurities contained in the liquid high molecular substance are removed. However, since the bank layer 22 is an organic material, such as one of the polyimide groups that have good interface characteristics with the high molecular substance, the electroluminescent layer 23 of the high molecular substance is positioned not only on the first electrode 21 but also on the bank layer 22 around the bank opening 22a, especially on side and top surfaces of the bank layer 22.

To prevent the electroluminescent layer 23 from being formed on the surfaces of the bank layer 22, a plasma treatment may be conducted on the electroluminescent layer 23 of high molecular substance. However, the plasma treatment causes the electroluminescent layer 23 to have poor interface characteristics with the first electrode 21, thereby preventing adequate bonding to the first electrode 21, Accordingly, the electroluminescent layer 23 delaminates due to thermal stresses when the electroluminescent layer 23 is operated for a long period of time, thereby significantly reducing its operational life span.

In addition, since the electroluminescent layer 23 is disposed on inclined side and top surfaces of the bank layer 22, as denoted by portions C in FIGS. 2 and 3, the light emitted from the portions C of the electroluminescent layer 23 has abnormally paths, as compared to the light emitted from a portion B where the electroluminescent layer 23 is disposed on the first electrode 21. The light generated in the portions C provides different spectral distributions of red, green, and blue light, whereby the red, green, and blue colors are refracted and disperse. Accordingly, it is difficult for the organic electroluminescent display devices shown in FIGS. 1, 2, and 3 to achieve white balance and to obtain a gray level display.

SUMMARY OF THE INVENTION

Accordingly, the present invention is directed to an active matrix organic electroluminescent display device and method of fabricating the same that substantially obviates one or more of problems due to limitations and disadvantages of the related art.

An object of the present invention is to provide an active matrix organic electroluminescent display device having stable structure elements and prolonged operational life span.

Another object of the present invention is to provide a method of fabricating an active matrix organic electroluminescent display device having prolonged operational life and high resolution and picture quality.

Another object of the present invention is to provide an active matrix organic electroluminescent display device having high resolution and picture quality.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescent device includes a substrate, a buffer layer on the substrate, a thin film transistor on the buffer layer, a passivation layer on an entire surface of the substrate covering the thin film transistor, a first electrode disposed on the passivation layer to contact the thin film transistor through a contact hole formed in the passivation layer, a first bank layer disposed on the first electrode and on the passivation layer, the first bank layer having a first bank opening exposing a portion of the first electrode, a second bank layer disposed on the first bank layer to have a second bank opening aligned with the first bank opening, an organic electroluminescent layer formed within the first bank opening to electrically contact the first electrode and the first bank layer, and a second electrode formed on the organic electroluminescent layer and on the second bank layer within the first and second bank openings.

In another aspect, a method of fabricating an active matrix organic electroluminescent device includes forming a buffer layer on a substrate, forming a thin film transistor on the buffer layer, forming a passivation layer over the substrate to cover the thin film transistor, forming a first electrode on the passivation layer to electrically contact the thin film transistor through a contact hole formed in the passivation layer, forming a first bank layer on the first electrode and on the passivation layer, forming a second bank layer on the first bank layer, forming a bank opening through the first and second bank layers to expose a portion of the first electrode, forming an organic electroluminescent layer within the bank opening to contact the first electrode and the first bank layer, and forming a second electrode on the organic electroluminescent layer and on the second bank layer.

In another aspect, an active matrix organic electroluminescent device includes a substrate, a buffer layer on the substrate, a thin film transistor on the buffer layer, a gate line on the buffer layer, a first insulating layer on the thin film transistor and the gate line, a power line on the first insulating layer over the gate line, a second insulating layer on the first insulating layer and the power line, a first electrode disposed on the second insulating layer, the first electrode electrically contacts the thin film transistor through a first hole formed in the first and second insulating layers and electrically contacts the power line through a second hole formed in the second insulating layer, a passivation layer disposed on an entire surface of the substrate covering the second interlayer insulating layer and the thin film transistor, a second electrode disposed on the passivation layer to contact the thin film transistor through a third contact hole formed in the passivation layer, a first bank layer disposed on the second electrode and on the passivation layer, the first bank layer having a first bank opening exposing a portion of the second electrode, a second bank layer disposed on the first bank layer to have a second bank opening aligned with the first bank opening, an organic electroluminescent layer disposed within the first bank opening to electrically contact the second electrode and the first bank layer, and a third electrode disposed on the organic electroluminescent layer and on the second bank layer within the first and second bank openings.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to an embodiment of the present invention, example of which is illustrated in the accompanying drawings.

Figure 4:
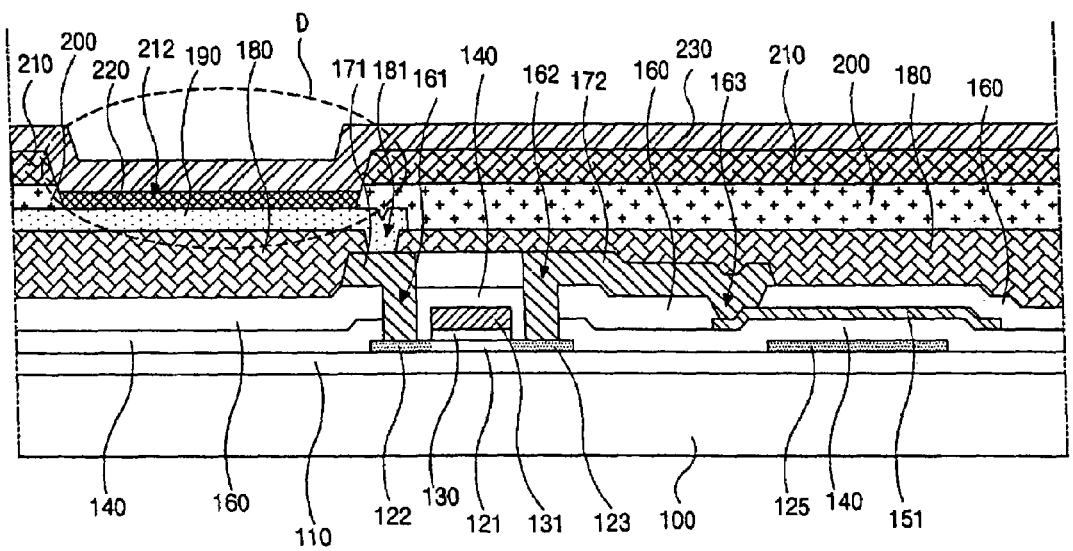
FIG. 4 is a cross sectional view of an exemplary active matrix organic electro luminescent display device according to the present invention.

FIG. 4 is a cross sectional view of an exemplary active matrix organic electroluminescent display device according to the present invention. In FIG. 4, a buffer layer 110 may be formed on a substrate 100, and a first polycrystalline silicon layer having first, second, and third portions 121, 122, and 123 and a second polycrystalline silicon layer 125 may be formed on the buffer layer 110. The first polycrystalline silicon layer may be divided into the first portion 121 (i.e., an active region) where impurities are not doped, the second portion 122 (i.e., a drain region), and the third portion 123 (i.e., a source region) where the impurities, such as ions, are doped. In addition, the second polycrystalline silicon layer 125 may function as a capacitor electrode.

A gate insulation layer 130 may be disposed on the active region 121, and a gate electrode 131 may be disposed on the gate insulation layer 130. A first interlayer insulator 140 may be formed on the gate insulation layer 130 and on the gate electrode 131 to cover the drain and source regions 122 and 123 and the second polycrystalline silicon layer 125. A power line 151 may be disposed on the first interlayer insulator 140 above the second polycrystalline silicon layer 125 (i.e., the capacitor electrode). Although not shown, the power line 151 may extend as a line along one direction. The power line 151 and the second polycrystalline silicon layer 125 may form a storage capacitor with the first interlayer insulator 140 interposed therebetween. A second interlayer insulator 160 may be formed on the first interlayer insulator 140 to cover the power line 151.

First and second contact holes 161 and 162 may be formed to penetrate both the first and second interlayer insulators 140 and 160 to expose portions of the drain region 122 and source region 123. In addition, a third contact hole 163 may be formed to penetrate the second interlayer insulator 160 to expose a portion of the power line 151. A drain electrode 171 and source electrode 172 may be formed on the second interlayer insulator 160, whereby the drain electrode 171 contacts the drain region 122 through the first contact hole 161, and the source electrode 172 contacts both the source region 123 and the power line 151 through the second contact hole 162 and through the third contact hole 163, respectively. A passivation layer 180 may be formed on the drain and source electrodes 171 and 172 and on exposed portions of the second interlayer insulator 160, whereby the passivation layer 180 may have a planar upper surface. In addition, the passivation layer 180 may have a fourth contact hole 181 that exposes a portion of the drain electrode 171. Then, a first electrode 190 made of a transparent conductive material may be disposed on the planar upper surface of the passivation layer 180 and may electrically contact the drain electrode 171 through the fourth contact hole 181. The transparent conductive material for the first electrode 190 may include indium-tin-oxide (ITO) or indium-zinc-oxide (IZO).

In FIG. 4, first and second bank layers 200 and 210 may be formed on the first electrode 190 and on the exposed portions of the passivation layer 180, whereby the first and second bank layers 200 and 210 may have a bank opening 212 (often referred to as a bank) that exposes a portion of the first electrode 190. An organic electroluminescent layer 220 may be formed within the bank opening 212 of the first bank layer 200, especially on the first electrode 190. Then, a second electrode 230 may be formed over an entire surface of the substrate 100 to overlap the second bank layer 210 and the organic electroluminescent layer 220. The second electrode 230 may include opaque metallic materials including aluminum (Al), aluminum alloys (e.g., AlNd), and calcium (Ca).

Figure 5:
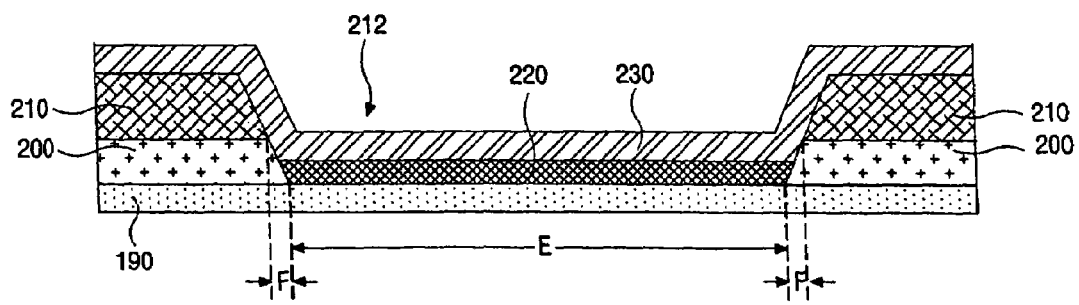
FIG. 5 is an enlarged cross sectional view of an exemplary portion D of FIG. 4 according to the present invention.
Figure 6:
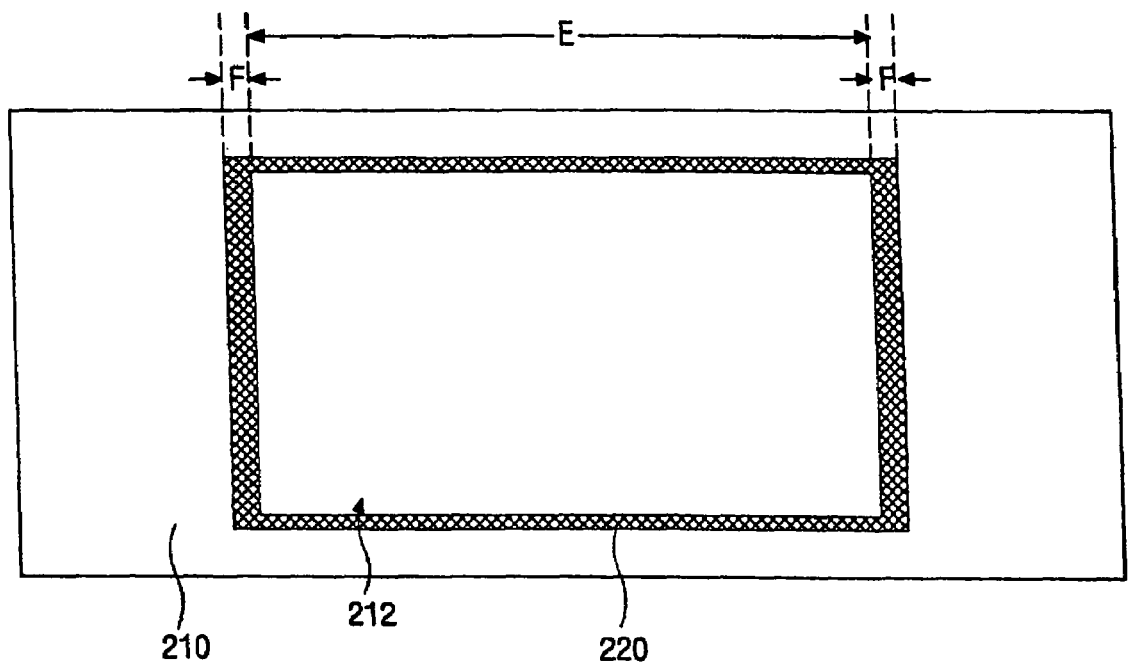
FIG. 6 is a plan view of the enlarged portion D of FIGS. 4 and 5 according to the present invention.

FIG. 5 is an enlarged cross sectional view of an exemplary portion D of FIG. 4 according to the present invention, and FIG. 6 is a plan view of the enlarged portion D of FIGS. 4 and 5 according to the present invention. In FIGS. 5 and 6, the organic electroluminescent layer 220 may be formed only within the bank opening 212. Accordingly, the organic electroluminescent layer 220 is only on the first electrode 190 and does not overlap the second bank layer 210. Although the first and second bank layers 200 and 210 may be formed of organic materials, the first bank layer 200 is formed of a material having hydrophilic properties and the second bank layer 210 is formed of a material having hydrophobic properties. The hydrophilic properties of the first bank layer 200 accelerates adhesive strength with the organic electroluminescent layer 220, and the hydrophobic properties of the second bank layer 210 decelerates adhesive strength with the organic electroluminescent layer 220. A high molecular substance may be dissolved in a solvent and deposited onto top and inclined side surfaces of the second bank layer 210 when forming the organic electroluminescent layer 220. Accordingly, the dissolved high molecular substance may easily flow downward into the bank opening 212 since it does not have good adhesive properties with the hydrophobic second bank layer 210. In addition, a thickness of the first bank layer 200 may be larger than a thickness of the organic electroluminescent layer 220 so that the organic electroluminescent layer 220 does not contact the second bank layer 200. For example, the first bank layer 200 may have a thickness twice as much as a thickness of the organic electroluminescent layer 220, and the second bank layer 210 may also have a thickness of more than 0.5 micrometers (µm).

Figure 1:
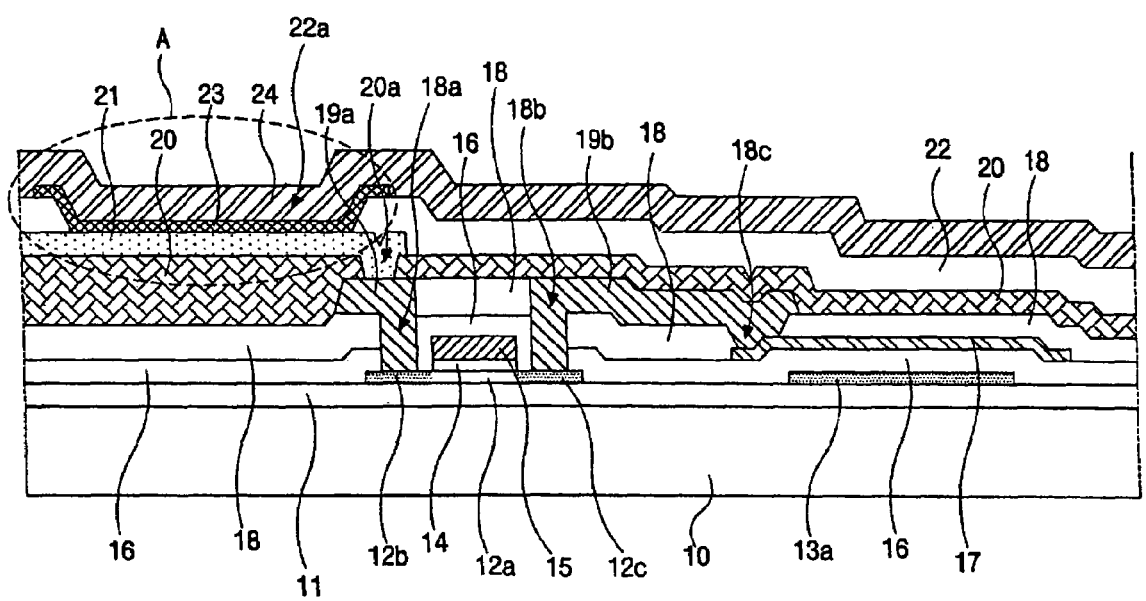
FIG. 1 is a cross sectional view of an active matrix organic electro luminescent display device according to the related art.
Figure 2:
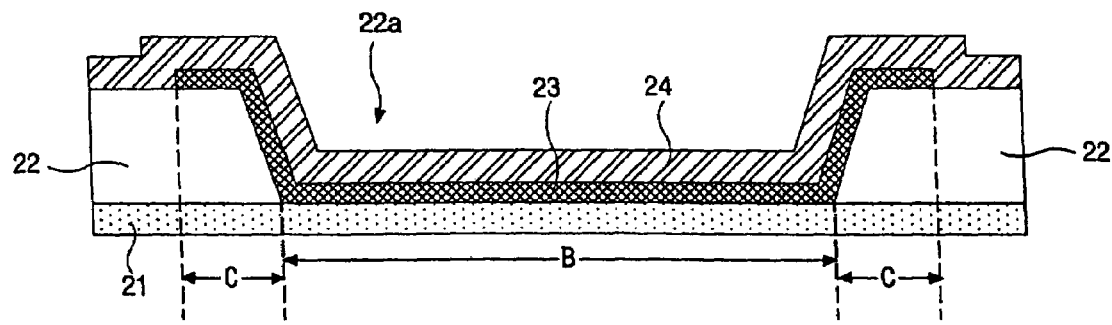
FIG. 2 is an enlarged cross sectional view of a portion A of FIG. 1 according to the related art.
Figure 3:
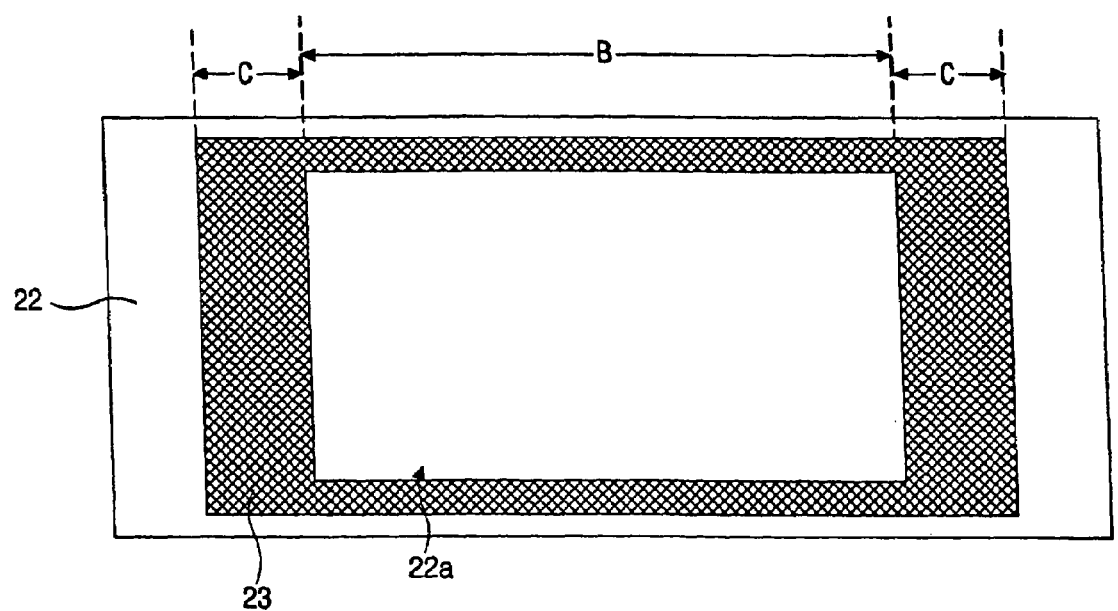
FIG. 3 is a plan view of the enlarged portion A of FIGS. 1 and 2 according to the related art.

Since the organic electroluminescent layer 220 is disposed only within the bank opening 212 and not on the top or side surfaces of the bank layers 200 and 210, the delamination phenomenon of the organic electroluminescent layer 220 may be prevented. In addition, since the organic electroluminescent layer 220 adheres much more to the hydrophilic first bank layer 200, the organic electroluminescent layer 220 can be much more stable and the operational life span of the organic electroluminescent layer 220 may be prolonged. Furthermore, when comparing FIGS. 5 and 6 to FIGS. 2 and 3, the portions C in FIGS. 2 and 3 is decreased to become portions F of FIGS. 5 and 6 where the electroluminescent layer 220 contacts only the first bank layer 200. Thus, an essential light-emitting area E may become larger, thereby improving resolution and image quality.

Figure 7A:
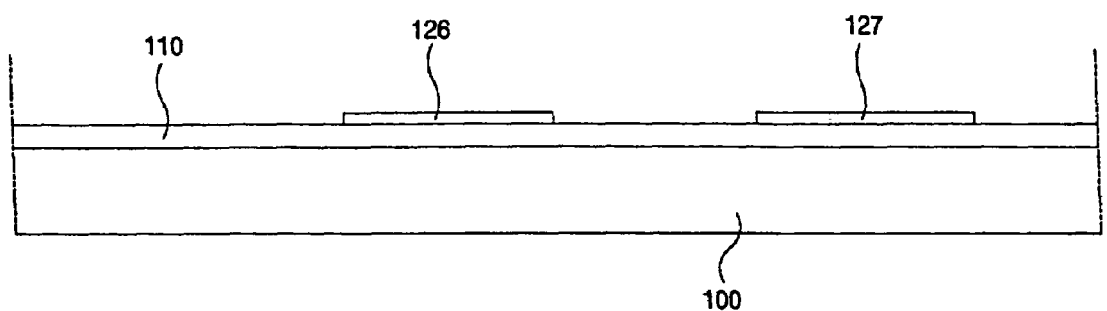
FIGS. 7A to 7J are cross sectional views of an exemplary fabricating process of an active matrix organic electro luminescent display device of FIG. 4 according to the present invention.

FIGS. 7A to 7J are cross sectional views of an exemplary fabricating process of an active matrix organic electro luminescent display device of FIG. 4 according to the present invention. Many of the layer patterns shown in FIGS. 7A to 7J may be formed through photolithographic processes using photoresist (PR) coatings, aligning, and exposure and developing steps using a mask. In FIG. 7A, after a buffer layer 110 is formed on an entire surface of a substrate 100, first and second silicon layers 126 and 127 of polycrystalline may be formed on the buffer layer 110 through a first mask process, wherein the first and second polycrystalline silicon layers 126 and 127 may have island shapes.

Figure 7B:
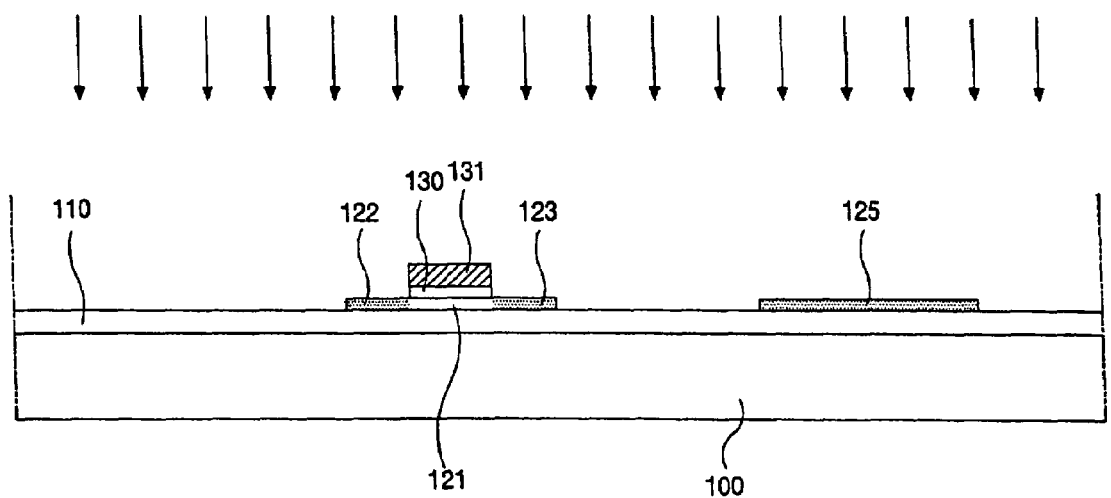

In FIG. 7B, an insulator of silicon nitride or silicon oxide and a conductive material of metal may be sequentially deposited onto the first polycrystalline silicon layer 126, and then patterned using a second mask. Accordingly, a gate insulation layer 130 and a gate electrode 131 may be sequentially formed on the first polycrystalline silicon layer 126. Then, p-type or n-type ion impurities may be doped on exposed portions of the first and second polycrystalline silicon layers 126 and 127. During the doping process, since the gate electrode 131 acts as a mask, the first polycrystalline silicon layer 126 may be divided into an active region 121 where the impurities are not doped, and drain and source regions 123 and 123 where the impurities are doped. Furthermore, the second polycrystalline silicon layer 127 upon which the impurities are fully doped may function as a capacitor electrode 125.

Figure 7C:
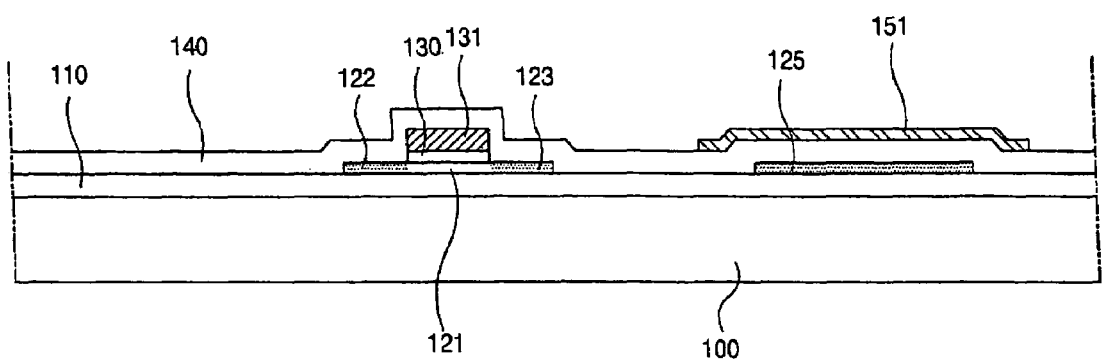

In FIG. 7C, a first interlayer insulator 140 may be formed on an entire surface of the buffer layer 110 to cover the gate electrode 131, the drain and source regions 122 and 123, and the capacitor electrode 125. Then, a power line 151 made of a metal material may be formed through a third mask process on the first interlayer insulator 140 to overlap the capacitor electrode 125. Since the power line 151 may be formed above the capacitor electrode 125, a storage capacitor may be formed with the capacitor electrode 125 and the interposed first interlayer insulator 140.

Figure 7D:
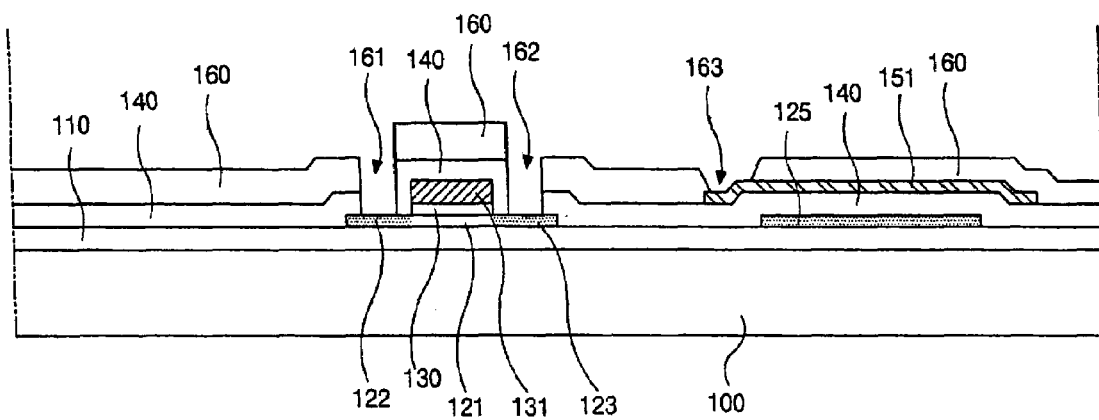

In FIG. 7D, a second interlayer insulator 160 may be formed on the first interlayer insulator 140 and on the power line 151. Then, first, second, and third contact holes 161, 162, and 163 may be formed using a fourth mask process. The first contact hole 161 exposes a portion of the drain region 122, the second contact hole 162 expose a portion of the source region 123, and the third contact hole 163 expose a portion of the power line 151. The first and second contact holes 161 and 162 may be formed to penetrate the first and second interlayer insulator 140 and 160, and the third contact hole 163 may be formed to penetrate only the second interlayer insulator 160.

Figure 7E:
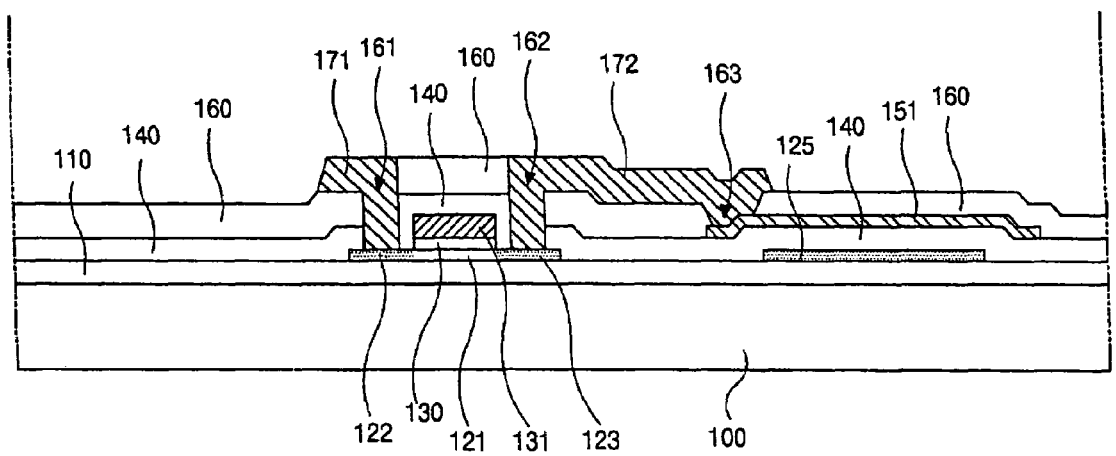

In FIG. 7E, a metal layer may be formed on the second passivation layer 160, and then may be patterned through a fifth mask process, thereby forming a drain electrode 171 and a source electrode 172. The drain electrode 171 may electrically contact the drain region 122 through the first contact hole 161, and the source electrode 172 may electrically contact the source region 123 through the second contact hole 162. In addition, the source electrode 172 may electrically contact the power line 51 through the third contact hole 163. Thus, a driving thin film transistor may be formed having the active region 121, the gate electrode 131, and the drain and source electrodes 171 and 172. Moreover, a region corresponding to the power line 151 and the capacitor electrode 125 may comprise the storage capacitor.

Figure 7F:
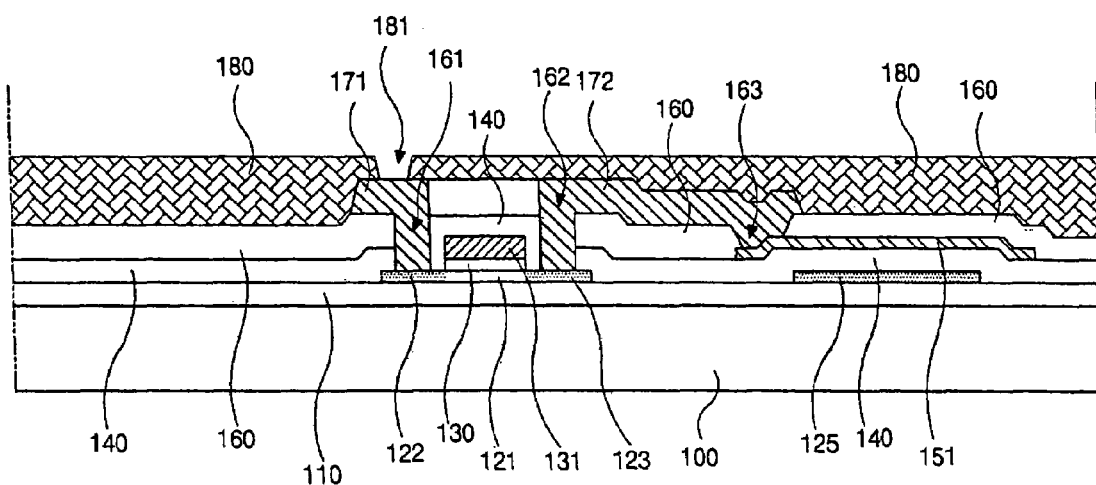

In FIG. 7F, a passivation layer 180 having a fourth contact hole 181 resulting from a sixth mask process may be formed on the second interlayer insulator 160 to cover the drain and source electrodes 171 and 172. The fourth contact hole 181 may be formed to expose a portion of the drain electrode 171. The passivation layer 180 may include a planar upper surface.

Figure 7G:
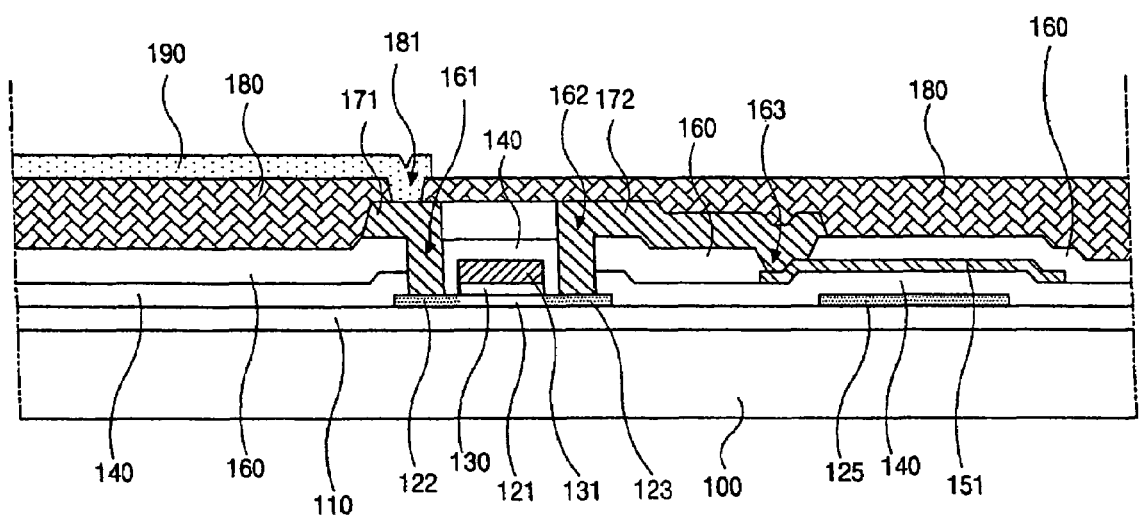

In FIG. 7G, a transparent conductive material may be deposited upon the planar upper surface of the passivation layer 180, and then may be patterned using a seventh mask process, thereby forming a first electrode 190 that electrically contacts the drain electrode 171 through the fourth contact hole 181. The transparent conductive material may include indium tin oxide (ITO) or indium zinc oxide (IZO).

Figure 7H:
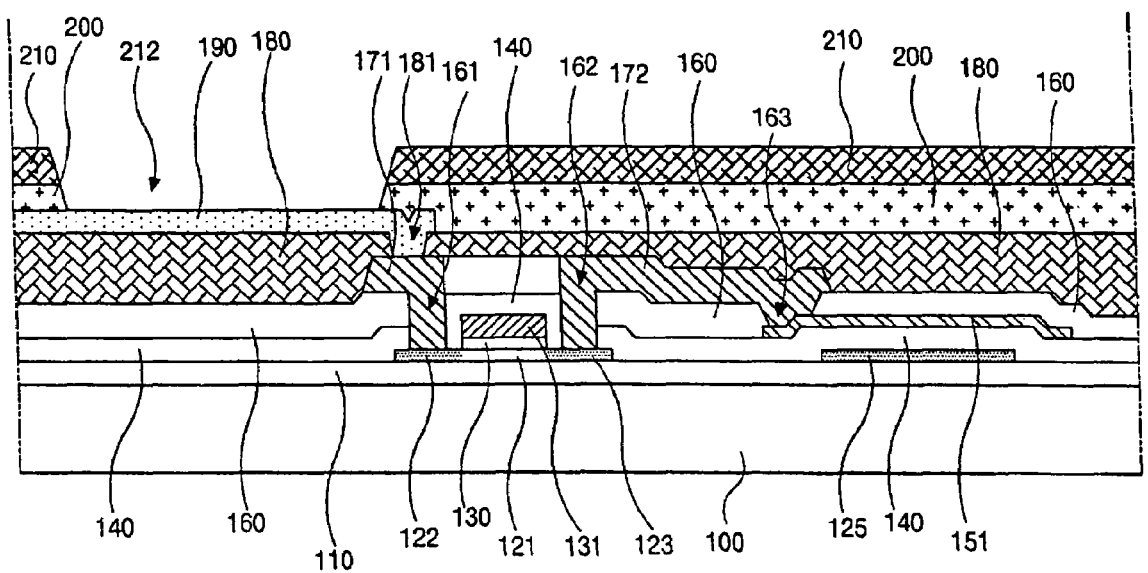

In FIG. 7H, first and second bank layers 200 and 210 may be sequentially formed on the first electrode 190 and on exposed portions of the passivation layer 180. Then, the first and second bank layers 200 and 210 may be patterned using an eighth mask process, thereby forming a bank opening 212 that exposes a portion of the first electrode 190. In addition, the first bank layer 200 may include a hydrophilic organic film, and the second bank layer 210 may include a hydrophobic organic film.

Figure 7I:
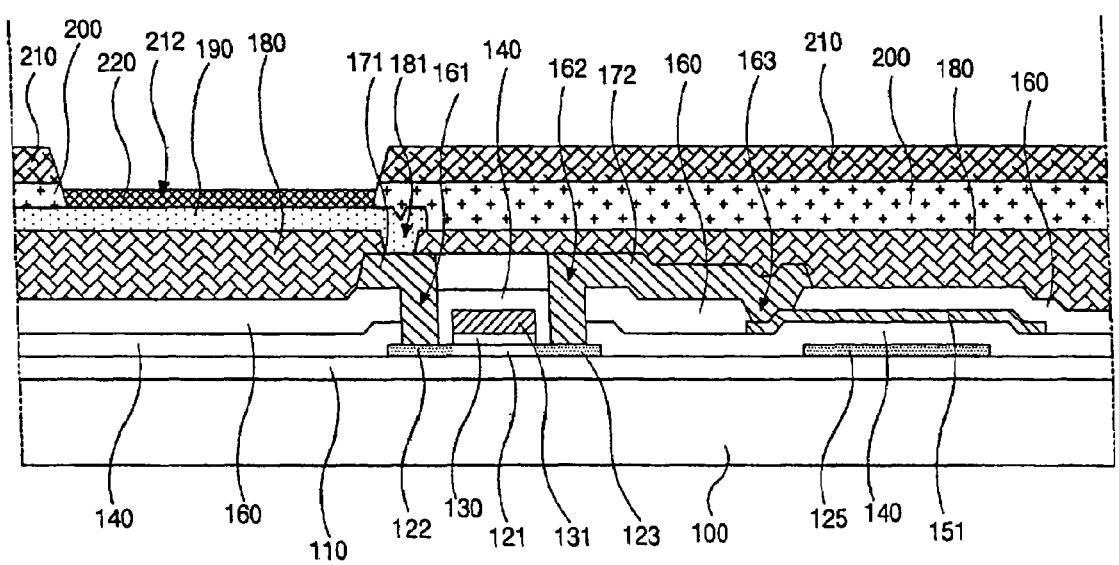

In FIG. 7I, an organic electroluminescent layer 220 may be formed within the bank opening 212 using ink-jet or lithographic processes. Although the organic electroluminescent layer 220 may be disposed on inclined side surfaces of the second bank layer 210 when forming the organic electroluminescent layer 220, the high molecular substance for the organic electroluminescent layer 220 may flow downward into the bank opening 212. The high molecular substance for forming the organic electroluminescent layer 220 does not have the good adhesive strength with the second bank layer 210 due to the hydrophobic properties. Accordingly, since the first bank layer 200 is hydrophilic, the organic electroluminescent layer 220 sufficiently adheres to the first bank layer 200 within the bank opening 212. Thus, delamination between the first bank layer 200 and the organic electroluminescent layer 220 does not occur. The organic electroluminescent layer 220 may be formed of a thickness less than a thickness of the first bank layer 200, and may be laterally surrounded by the first bank layer 200. For example, the first bank layer 200 may be twice as thick as the organic electroluminescent layer 220, wherein the second bank layer 210 may have a thickness of more than about 0.5 micrometers (μm).

Figure 7J:
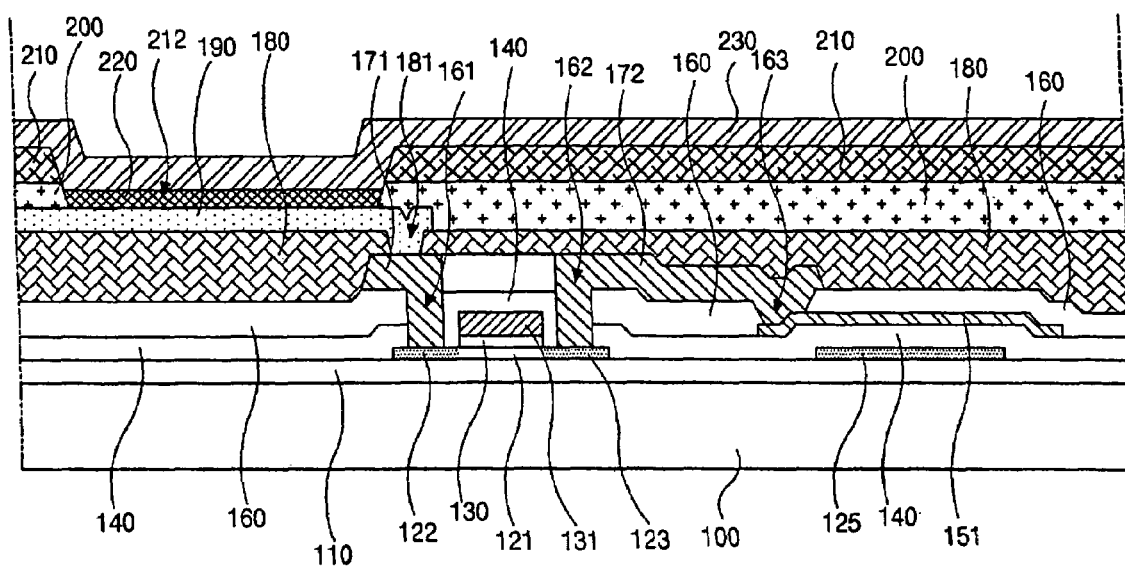

In FIG. 7J, after forming the organic electroluminescent layer 220, a second electrode 230 may be formed on the organic electroluminescent layer 220 and on the second bank layer 210. The cathode electrode 24 may include an opaque conductive material and may cover the entire substrate 100.

During the above processes, the hydrophilic bank layer and the hydrophobic bank layer both having the bank opening may be sequentially formed on the first electrode. Then, the organic electroluminescent layer may be formed within the bank opening of the hydrophilic bank layer, wherein the organic electroluminescent layer does not contact the hydrophobic bank layer but is surrounded by and contacts the hydrophilic bank layer. Accordingly, delamination of the organic electroluminescent layer may be prevented and operational life span of the organic electroluminescent layer may be increased. Furthermore, since the organic electroluminescent layer is confined within the bank opening of the hydrophilic bank layer, abnormal light pathways of the organic electroluminescent layer are prevented. Accordingly, normal light pathways may be enlarged, and image quality of the active matrix organic electroluminescent display device may be improved.

It will be apparent to those skilled in the art that various modifications and variation can be made in the active matrix organic electroluminescent display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an active matrix organic electroluminescent device, comprising steps of:
    forming a buffer layer on a substrate;
    forming a thin film transistor on the buffer layer;
    forming a passivation layer over the substrate to cover the thin film transistor;
    forming a first electrode on the passivation layer to electrically contact the thin film transistor through a contact hole formed in the passivation layer;
    forming a first bank layer on the first electrode and on the passivation layer;
    forming a second bank layer on the first bank layer;
    forming a bank opening through the first and second bank layers to expose a portion of the first electrode;
    forming an organic electroluminescent layer within the bank opening to contact the first electrode and the first bank layer; and
    forming a second electrode on the organic electroluminescent layer and on the second bank layer,
    wherein the bank opening is spaced apart from the thin film transistor, sidewalls of the first and second bank layers defining the bank opening are coplanar, and both the first and second bank layers include an organic material.

2. The method according to claim 1, wherein the first bank layer includes a hydrophilic material.

3. The method according to claim 2, wherein a thickness of the first bank layer is greater than a thickness of the organic electroluminescent layer.

4. The method according to claim 3, wherein the thickness of the first bank layer is twice the thickness of the organic electroluminescent layer.

5. The method according to claim 1, wherein the second bank layer includes a hydrophobic material.

6. The method according to claim 1, wherein the organic electroluminescent layer is surrounded by the first bank layer.

7. The method according to claim 1, wherein the organic electroluminescent layer does not contact the second bank layer.

8. The method according to claim 1, wherein a thickness of the second bank layer is more than about 0.5 micrometers.

9. The method according to claim 1, wherein the step of forming an organic electroluminescent layer includes an ink-jet process.

10. The method according to claim 1, wherein the step of forming an organic electroluminescent layer includes a lithographic process.

* * * * *